(12) United States Patent
Cho

(10) Patent No.: US 10,490,505 B2
(45) Date of Patent: *Nov. 26, 2019

(54) SINGLE-SIDED POWER DEVICE PACKAGE

(71) Applicant: Infineon Technologies Americas Corp., El Segundo, CA (US)

(72) Inventor: Eung San Cho, Torrance, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/782,684

(22) Filed: Oct. 12, 2017

(65) Prior Publication Data
US 2018/0053722 A1     Feb. 22, 2018

Related U.S. Application Data

(63) Continuation of application No. 15/238,325, filed on Aug. 16, 2016, now Pat. No. 9,824,976.

(51) Int. Cl.
*H01L 29/66* (2006.01)
*H01L 23/538* (2006.01)
(Continued)

(52) U.S. Cl.
CPC ...... *H01L 23/5386* (2013.01); *H01L 21/4853* (2013.01); *H01L 23/5389* (2013.01);
(Continued)

(58) Field of Classification Search
CPC ............. H01L 23/5386; H01L 29/7827; H01L 23/5389; H01L 28/10; H01L 21/4853;
(Continued)

(56) References Cited

U.S. PATENT DOCUMENTS 7,727,813 B2   6/2010  Otremba et al.
7,804,131 B2   9/2010  Cheah et al.
(Continued)

FOREIGN PATENT DOCUMENTS

CN   101447442 A   6/2009
CN   102099919 A   6/2011
(Continued)

OTHER PUBLICATIONS

U.S. Appl. No. 15/238,325, filed by Eung San Cho, filed Aug. 16, 2016.

(Continued)

*Primary Examiner* — Caleb E Henry
(74) *Attorney, Agent, or Firm* — Shumaker & Sieffert, P.A.

(57) ABSTRACT

In some examples, a circuit package further includes an insulating layer and a first transistor extending through the insulating layer, where the first transistor includes a first control terminal on a top side of the insulating layer, a first source terminal on the top side of the insulating layer, and a first drain terminal on a bottom side of the insulating layer. The circuit package includes a second transistor extending through the insulating layer, where the second transistor includes a second control terminal on the top side of the insulating layer, a second source terminal on the bottom side of the insulating layer, and a second drain terminal on the top side of the insulating layer.

20 Claims, 7 Drawing Sheets

(51) Int. Cl.
  *H01L 29/78* (2006.01)
  *H01L 49/02* (2006.01)
  *H01L 21/48* (2006.01)
  *H02M 3/158* (2006.01)
  *H01L 23/00* (2006.01)

(52) U.S. Cl.
  CPC .............. *H01L 24/20* (2013.01); *H01L 24/96* (2013.01); *H01L 28/10* (2013.01); *H01L 29/7827* (2013.01); *H02M 3/158* (2013.01); *H01L 21/486* (2013.01); *H01L 23/5384* (2013.01); *H01L 2224/04105* (2013.01); *H01L 2224/06181* (2013.01); *H01L 2224/24137* (2013.01); *H01L 2224/2518* (2013.01); *H01L 2924/13091* (2013.01); *H01L 2924/19042* (2013.01); *H02M 3/1588* (2013.01); *Y02B 70/1466* (2013.01)

(58) Field of Classification Search
  CPC .............. H01L 21/486; H01L 23/5384; H01L 25/04–0756; H01L 25/072; H01L 25/115; H01L 2924/1306; H01L 2924/13091; H01L 2224/06181; H02M 3/158
  See application file for complete search history.

(56) References Cited

U.S. PATENT DOCUMENTS

| | | | |
|---|---|---|---|
| 8,629,499 | B2 | 1/2014 | Ashrafadeh |
| 2009/0057822 | A1 | 3/2009 | Wen et al. |
| 2013/0221526 | A1* | 8/2013 | Lange .................... H01L 21/50 257/750 |
| 2014/0110788 | A1* | 4/2014 | Cho ....................... H01L 24/18 257/368 |
| 2015/0054159 | A1 | 2/2015 | Hoegerl et al. |
| 2015/0145111 | A1 | 5/2015 | Mengel et al. |
| 2015/0162271 | A1 | 6/2015 | Ye |

FOREIGN PATENT DOCUMENTS

| | | |
|---|---|---|
| CN | 104170082 A | 11/2014 |
| DE | 102014111829 A1 | 2/2015 |
| DE | 102014117086 A1 | 5/2015 |

OTHER PUBLICATIONS

Prosecution History from U.S. Appl. No. 15/238,325, dated from Mar. 8, 2017 through Oct. 9, 2017, 36 pp.

Office Action, in the German language, from counterpart German Application No. 102017213872.6, dated Jan. 25, 2019, 5 pp.

Office Action, in the Chinese language, from counterpart Chinese Application No. 201710598826.6, dated Aug. 27, 2019, 5 pp.

\* cited by examiner

SINGLE-SIDED POWER DEVICE PACKAGE

The present application is a continuation of U.S. application Ser. No. 15/238,325, filed Aug. 16, 2016, the entirety of which is hereby incorporated by reference.

TECHNICAL FIELD

This disclosure relates to semiconductor packaging.

BACKGROUND

Surface-mount technology (SMT) is a production method for electronics that involves attaching components and devices on a printed circuit board (PCB). Components and devices may be soldered on the PCB to provide stability and electrical connections through traces in the PCB. The traces may conduct electricity and provide inputs and outputs for the components and devices mounted on the PCB.

SUMMARY

This disclosure describes techniques for a circuit package that includes an insulating layer and a first transistor extending through the insulating layer, where the first transistor includes a first control terminal on a top side of the insulating layer, a first source terminal on the top side of the insulating layer, and a first drain terminal on a bottom side of the insulating layer. The circuit package further includes a second transistor extending through the insulating layer, where the second transistor includes a second control terminal on the top side of the insulating layer, a second source terminal on the bottom side of the insulating layer, and a second drain terminal on the top side of the insulating layer.

In some examples, a method includes attaching a first transistor to an insulating layer, where the first transistor includes a first control terminal on a top side of the insulating layer a first drain terminal on the top side of the insulating layer, and a first source terminal on a bottom side of the insulating layer. The method further includes attaching a second transistor to the insulating layer, where the second transistor includes a second control terminal on the top side of the insulating layer, a second source terminal on the bottom side of the insulating layer, and a second drain terminal on the top side of the insulating layer.

In some examples, a device includes an insulating layer and a first transistor extending through the insulating layer, where the first transistor includes a first control terminal on a top side of the insulating layer, a first source terminal on the top side of the insulating layer, and a first drain terminal on a bottom side of the insulating layer. The device further includes a second transistor extending through the insulating layer, where the second transistor includes a second control terminal on the top side of the insulating layer, a second source terminal on the bottom side of the insulating layer, and a second drain terminal on the top side of the insulating layer. The device further includes an inductor and a conductive path that is electrically connected to the first source terminal, the second drain terminal, and the inductor, wherein the conductive path does not extend into the insulating layer.

The details of one or more examples are set forth in the accompanying drawings and the description below. Other features, objects, and advantages will be apparent from the description and drawings, and from the claims.

DETAILED DESCRIPTION

Figure 1:
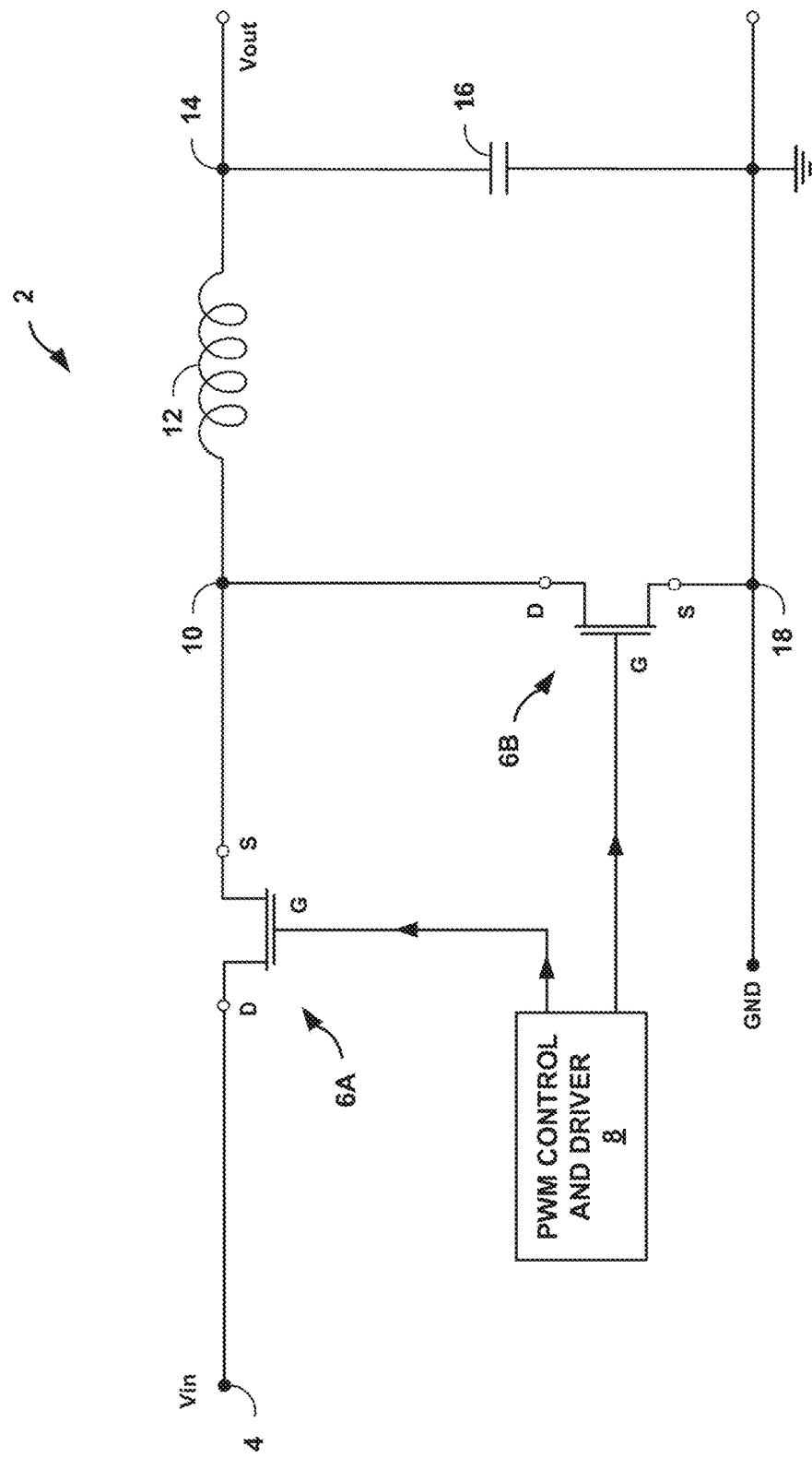
FIG. 1 is a circuit diagram for a power converter, in accordance with some examples of this disclosure.

FIG. 1 is a circuit diagram for a power converter 2, in accordance with some examples of this disclosure. In some examples, power converter 2 may comprise a half-bridge direct-current-to-direct-current (DC-to-DC) buck converter for converting an input DC signal to an output DC signal with a lower voltage. As a DC-to-DC buck converter, power converter 2 may operate as a voltage regulator in a variety of applications. In some examples, power converter 2 may be designed to handle large amounts of current and high voltages. However, the techniques of this disclosure may apply to other circuits and configurations, such as other power converters, including multi-phase power converters.

Power converter 2 may include transistors 6A, 6B, inductor 12, capacitor 16, and pulse-width modulation (PWM) control and driver 8. In some examples, power converter 2 may contain more or fewer components than depicted in FIG. 1. Power converter 2 may include input node 4, output node 14, and reference node 18, as well as other nodes not shown in FIG. 1. Nodes 4, 14, 18 may be configured to connect to external components. For example, input node 4 may connect to an input voltage such as a power supply, output node 14 may connect to a load such as an electronic device, reference node 18 may connect to a reference voltage, such as reference ground. In some examples, PWM control and driver 8 may connect to an external circuit through a node (not shown in FIG. 1).

Transistors 6A, 6B may comprise metal-oxide semiconductor (MOS) field-effect transistors (FETs), bipolar junction transistors (BJTs), and/or insulated-gate bipolar transistors (IGBTs), high-electron-mobility transistors (HEMTs), gallium-nitride (GaN) based transistors, or other elements that use voltage for control. Transistors 6A, 6B may comprise n-type transistors or p-type transistors, and transistors 6A, 6B may comprise vertical power transistors. For a vertical power transistor, the source terminal and the drain terminal may be on opposite sides or opposite surfaces of the transistor. Current in a vertical power transistor may flow through the transistor from top to bottom. For example, an n-type MOSFET may include an n-channel for electrons to flow through a p-substrate between load terminals. In some examples, transistors 6A, 6B may comprise other analog devices such as diodes. Transistors 6A, 6B may also include freewheeling diodes connected in parallel with transistors to prevent reverse breakdown of transistors 6A, 6B. In some examples, transistors 6A, 6B may operate as switches or as analog devices. In still other examples, transistors 6 may include more than two transistors, such as in multi-phase power converters or other more complex power circuits.

FIG. 1 depicts transistors 6A, 6B with three terminals: drain (D), source (S), and gate (G). The drain and source may be load terminals, and the gate may be a control terminal. Current may flow between the drain and source of transistors 6A, 6B, based on the voltage at the gate. Current may flow from input node 4 to switch node 10, through the drain and source of transistor 6A, based on the voltage at the gate of transistor 6A. Current may flow from switch node 10 to reference node 18, through the drain and source of transistor 10B, based on the voltage at the gate of transistor 6B. Transistor 6A may comprise a high-side transistor, and transistor 6B may comprise a low-side transistor.

Transistors 6A, 6B may comprise various material compounds, such as silicon (Si), silicon carbide (SiC), Gallium Nitride (GaN), or any other combination of one or more semiconductor materials. To take advantage of higher power density requirements in some circuits, power converters may operate at higher frequencies. Improvements in magnetics and faster switching, such as Gallium Nitride (GaN) switches, may support higher frequency converters. These higher frequency circuits may require control signals to be sent with more precise timing than for lower frequency circuits.

PWM control and driver 8 may deliver signals and/or voltages to the control terminals of transistors 6A, 6B. FIG. 1 depicts PWM control and driver 8 as one component, but the PWM control circuit and the driver circuit may be separate components. In some examples, PWM control and driver 8, only the PWM control circuit, or only the driver circuit may be located outside of power converter 2.

Inductor 12 may comprise a coil inductor or any suitable inductor. Inductor 16 may connect to switch node 10 and output node 14. Inductor 12 may impede the flow of alternating-current (AC) electricity, while allowing DC electricity to flow between switch node 10 and output node 14.

Capacitor 16 may comprise a film capacitor, an electrolytic capacitor, a ceramic capacitor, or any suitable type of capacitor or capacitors. Capacitor 16 may be an optional component in power converter 2. Capacitor 16 may connect to output node 14 and reference node 18. Capacitor 16 may impede the flow of DC electricity, while allowing AC electricity to flow between output node 18 and reference node 18. Capacitor 16 may act as a smoothing capacitor for the voltage at output node 14 to moderate fluctuations in the voltage at output node 14.

Figure 2:
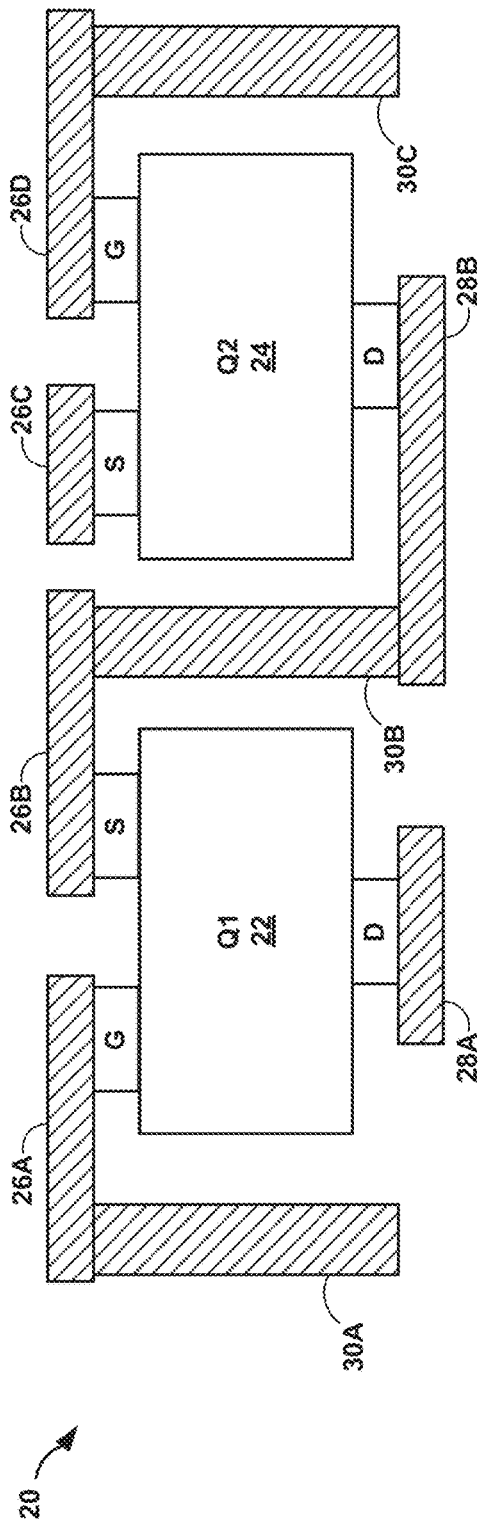
FIG. 2 is a cross-section diagram of a circuit package with two source-up transistors, in accordance with some examples of this disclosure.

FIG. 2 is a cross-section diagram of a circuit package 20 with two source-up transistors 22, 24, in accordance with some examples of this disclosure. Circuit package 20 may be a component in a power converter that is similar to power converter 2 in FIG. 1.

Transistors 22, 24 may each have a control terminal, labeled G for gate. Transistors 22, 24 may each have two load terminals, labeled S and D for source and drain. In some examples, transistors 22, 24 may be MOSFETs, BJTs, IGBTs, and/or any suitable type of transistor. If transistors 22, 24 are bipolar transistors, each control terminal may be a base and the load terminals may be emitters and collectors.

Transistors 22, 24 may be configured such that the source terminal of transistor 22 is electrically connected to the drain terminal of transistor 24. Horizontal conductive paths 26B, 28B and vertical conductive path 30B may form a connection between the source terminal of transistor 22 and the drain terminal of transistor 24. The conductive path between the source terminal of transistor 22 and the drain terminal of transistor 24 may be referred to as a switch node. By connecting the source terminal on the top side of transistor 22 and the drain terminal on the bottom side of transistor 24, the conductive path may be relatively long, as compared to a connection between two terminals on the top sides of transistors 22, 24. The length of the conductive path between the source terminal of transistor 22 and the drain terminal of transistor 24 may negatively impact the performance of circuit package 20 at high switching speeds, such as frequencies of more than three hundred kilohertz. The importance of parasitic capacitances and parasitic inductances increases as switching frequencies increase. A longer conductive path may cause higher parasitic capacitances and longer transmission times for signals between transistors 22, 24.

The remaining terminals of transistors 22, 24 may be connected to other conductive paths. For example, the gate terminal of transistor 22 may be connected by horizontal conductive path 26A and vertical conductive path 30A to a driver circuit (not shown in FIG. 2). The gate terminal of transistor 24 may be connected by horizontal conductive path 26D and vertical conductive path 30C to a driver circuit. The drain terminal of transistor 22 may be connected by horizontal conductive path 28A to an input node. The source terminal of transistor 24 may be connected by horizontal conductive path 26C to a reference node.

Figure 3:
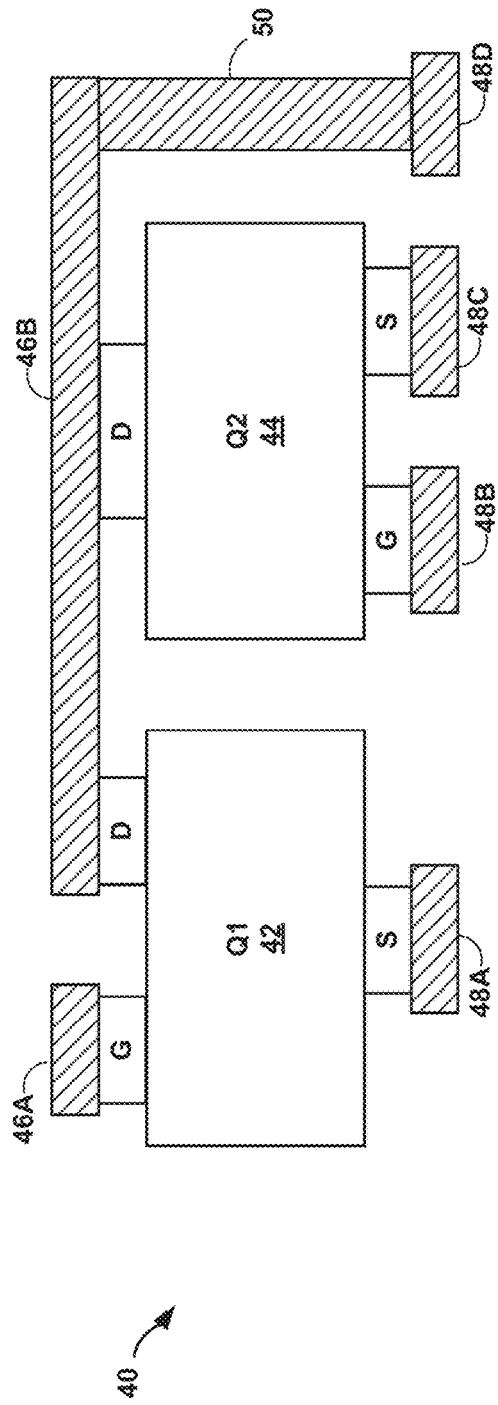
FIG. 3 is a cross-section diagram of a circuit package with two drain-up transistors, in accordance with some examples of this disclosure.

FIG. 3 is a cross-section diagram of a circuit package 40 with two drain-up transistors 42, 44, in accordance with some examples of this disclosure. Circuit package 40 may be a component in a power converter similar to power converter 2 in FIG. 1.

Transistors 42, 44 may each have a control terminal, labeled G for gate. Transistors 42, 44 may each have two load terminals, labeled S and D for source and drain. In some examples, transistors 42, 44 may be MOSFETs, BJTs, IGBTs, and/or any suitable type of transistor.

Transistors 42, 44 may be configured such that the drain terminal of transistor 42 is electrically connected to the drain terminal of transistor 44 through horizontal conductive path 46B. The length of the conductive path between the drain terminals of transistors 42, 44 may be shorter than the conductive path between transistors 22, 24 in FIG. 2. However, the design of a power converter may call for a source terminal of one transistor to connect to a drain terminal of another transistor.

The remaining terminals of transistors 42, 44 may be connected to other conductive paths. For example, the gate terminal of transistor 42 may be connected by horizontal conductive path 46A to a driver circuit (not shown in FIG. 3). The gate terminal of transistor 44 may be connected by horizontal conductive path 48B to a driver circuit. The source terminal of transistor 42 may be connected by horizontal conductive path 48A to an external node. The source terminal of transistor 44 may be connected by horizontal conductive path 48C to an external node.

Figure 4:
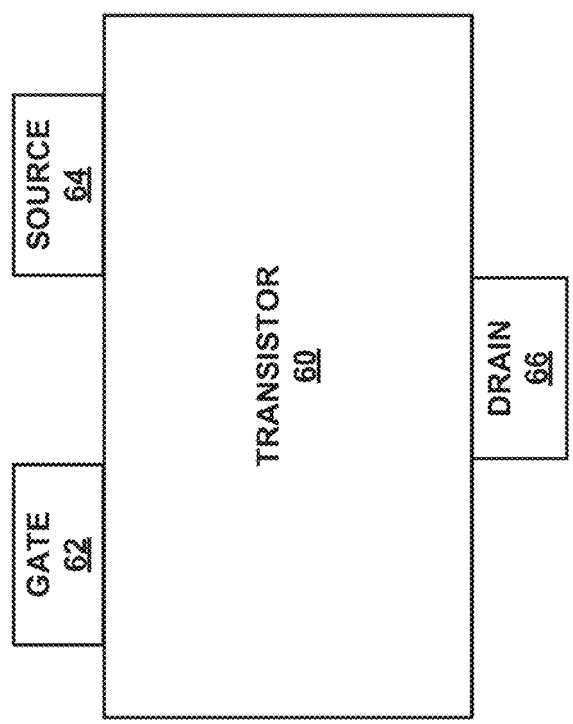
FIG. 4 is a block diagram of a source-up vertical transistor, in accordance with some examples of this disclosure.

FIG. 4 is a block diagram of a source-up vertical transistor 60, in accordance with some examples of this disclosure. Transistor 60 may be a power MOSFET for high-power applications. In some examples, transistor 60 may experience voltages from less than one volt up to two thousand volts and currents from less than one milliampere up to hundreds of amperes.

Transistor 60 may conduct current between source 64 and drain 66 based at least in part on the voltage at gate 62. Gate 62 may be electrically isolated from source 64 and drain 66. Transistor 60 may be oriented such that current flows vertically between the top and bottom sides of transistor 60.

Figure 5:
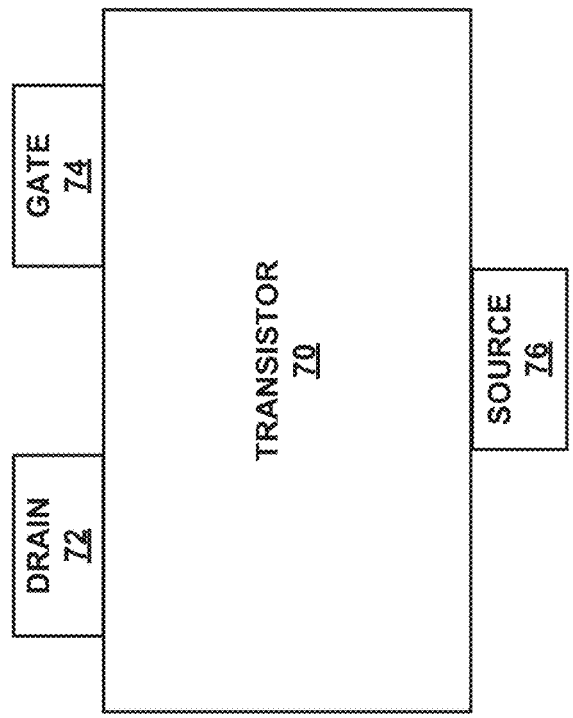
FIG. 5 is a block diagram of a drain-up vertical transistor, in accordance with some examples of this disclosure.

FIG. 5 is a block diagram of a drain-up vertical transistor 70, in accordance with some examples of this disclosure. Transistor 70 may be a power MOSFET for high-power applications. Transistor 70 may conduct current between drain 72 and source 76 based at least in part on the voltage at gate 74. Gate 74 may be electrically isolated from drain 72 and source 76. Transistor 70 may be oriented such that current flows vertically between the top and bottom sides of transistor 70.

Figure 6:
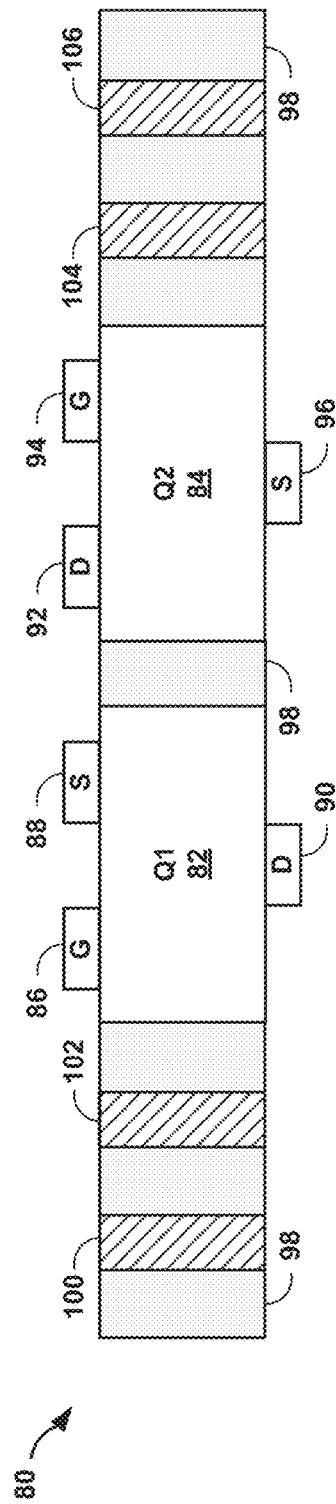
FIG. 6 is a cross-section diagram of a circuit package, in accordance with some examples of this disclosure.

FIG. 6 is a cross-section diagram of a circuit package 80, in accordance with some examples of this disclosure, Circuit package 80 may include transistors 82, 84, insulating layer 98, and vertical conductive paths 100, 102, 104, 106. Although not depicted in FIG. 6, circuit package 80 may include horizontal conductive paths for connecting the terminals of transistors 82, 84 and vertical conductive paths 100, 102, 104, 106.

Transistor 82 may be a vertical source-up MOSFET with gate 86, source 88, and drain 90. Transistor 84 may be a vertical drain-up MOSFET with drain 92, gate 94, and source 96. Transistors 82, 84 may be discrete components that are separated by insulating layer 98. In some examples, transistors 82, 84 may be integrated into an integrated circuit or semiconductor die. The terminals of transistors 82, 84 may be arranged such that the terminals are on a top side or a bottom side of insulating layer 98. For example, gate 86, source 88, drain 92, and gate 94 may be on the top side of insulating layer 98, and drain 90 and source 96 may be on the bottom side of insulating layer 98.

Insulating layer 98 may be a continuous layer or separate insulators that are arranged as a layer. Insulating layer 98 may surround and hold in place transistors 82, 84 and vertical conductive paths 100, 102, 104, 106. Insulating layer 98 may impede the flow of electricity between the components of circuit package 80. Insulating layer 98 may comprise pre-impregnated resin with reinforcing glass material, FR4, a laminate substrate, or any suitable material. Insulating layer 98 between transistors 82, 84 may comprise a resin material that is different than the material in insulating layer 98 that is adjacent to vertical conductive paths 100, 102, 104, 106. Insulating layer 98 may also comprise a solder mask across the top side of circuit package 80 to aid in the application of solder to vertical conductive paths 100, 102, 104, 106 and/or transistors 82, 84. The solder mask may protect areas that are not designed for solder.

Vertical conductive paths 100, 102, 104, 106 may be pre-plated copper pillars or any suitable material for forming conductive paths. As compared to laser-drilled vias, pre-plated copper pillars may have better current-carrying characteristics. Laser-drilled vias may have a conical shape, whereas pre-plated copper pillars may have a uniform cross section. A uniform cross section may reduce the resistance of a vertical conductive path, as compared to a conical or tapered cross section. Circuit package 80 may be attached to a printed circuit board (PCB) or any suitable device, such that drain 90, source 96, and vertical conductive paths 100, 102, 104, 106 are configured to conduct electricity with traces in the PCB.

In accordance with the techniques of this disclosure, circuit package 80 may include transistors 82, 84 that extend through insulating layer 98. Transistor 82 may be a source-up transistor, and transistor 84 may be a drain-up transistor. The source terminal of transistor 82 may connect to the drain terminal of transistor 84 for a shorter connection, reduced parasitic capacitances, and faster switching speeds, as compared to two source-up transistors or two drain-up transistors.

Circuit package 80 may experience other benefits due to the arrangement of transistors 82, 84. Circuit package 80 may dissipate heat more effectively because of shorter connections and pre-formed vertical conductive paths 100, 102, 104, 106. The connection between the source terminal of transistor 82 and the drain terminal of transistor 84 may provide for a short connection to an inductor (not shown in FIG. 6). In addition, pre-formed vertical conductive paths 100, 102, 104, 106 may not have metal layers on the bottom side of circuit package 80, unlike laser-drilled vias. Eliminating a metal layer on the bottom side of circuit package 80 may improve cost and efficiency while reducing manufacturing time.

Figure 7:
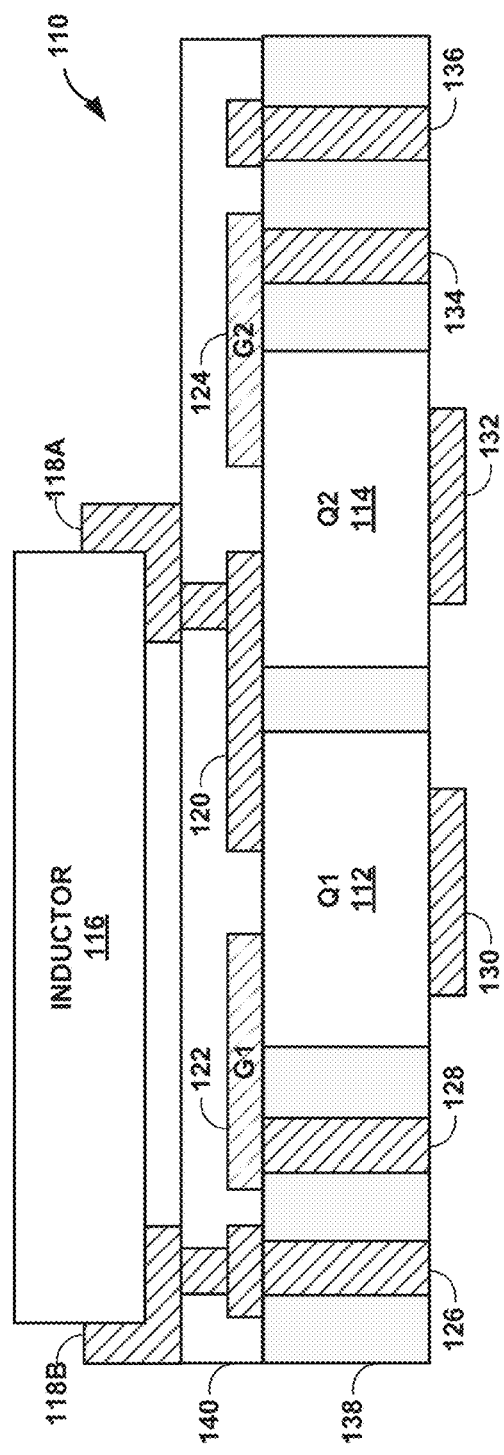
FIG. 7 is a cross-section diagram of a circuit package and an inductor, in accordance with some examples of this disclosure.

FIG. 7 is a cross-section diagram of a circuit package 110 and an inductor 116, in accordance with some examples of this disclosure. Inductor 116 may attach to insulating layer 140, which may attach to the top side of insulating layer 138. Inductor 116 may conduct electricity with transistors 112, 114 through horizontal conductive path 120, as described herein. Together, circuit package 110 and inductor 116 may form a power converter that is similar to power converter 2 in FIG. 1.

Transistors 112, 114 may be similar in arrangement and operation to transistors 82, 84 in FIG. 6. Horizontal conductive paths 120, 122, 124 may connect to terminals on the top sides of transistors 112, 114. Horizontal conductive path 120 may electrically connect the source terminal of transistor 112 and the drain terminal of transistor 114 to inductor 116. Horizontal conductive paths 122, 124 may connect the gate terminals of transistors 112, 114 to vertical conductive paths 128, 134 and, in some examples, external driver circuits. Conductors 130, 132 and vertical conductive paths 126, 128, 134, 136 may be configured to attach to and conduct electricity with traces in a PCB (not shown in FIG. 7).

Inductor 116 may include leads 118A, 118B for attaching to insulating layer 140 and conducting electricity with horizontal conductive path 120 and vertical conductive path 126. Inductor 116 may be a coil inductor or any suitable type of inductor. One end of inductor 116 may be electrically connected to the source terminal of transistor 112 and the drain terminal of transistor 114 through horizontal conductive path 120. The other end of inductor 116 may be electrically connected to vertical conductive path 126, which may connect to a trace in a PCB. In some examples, vertical conductive path 126 may operate in a similar manner to output node 14 in FIG. 1, and horizontal conductive path 120 may operate in a similar manner to switch node 10 in FIG. 1.

The arrangement of circuit package 110 may comprise only one metal layer with horizontal conductive paths 120, 122, 124, instead of an additional metal layer on the bottom side of circuit package 110. Pre-formed vertical conductive paths 126, 128, 134, 136 may function without a metal layer on the bottom side of circuit package 110 because of the uniform cross section of pre-formed vertical conductive paths 126, 128, 134, 136. Horizontal conductive paths 120, 122, 124 may be a backside metallization layer made of copper or any suitable conductor. In some examples, horizontal conductive paths 120, 122, 124 may not extend into insulating layer 138.

Figure 8:
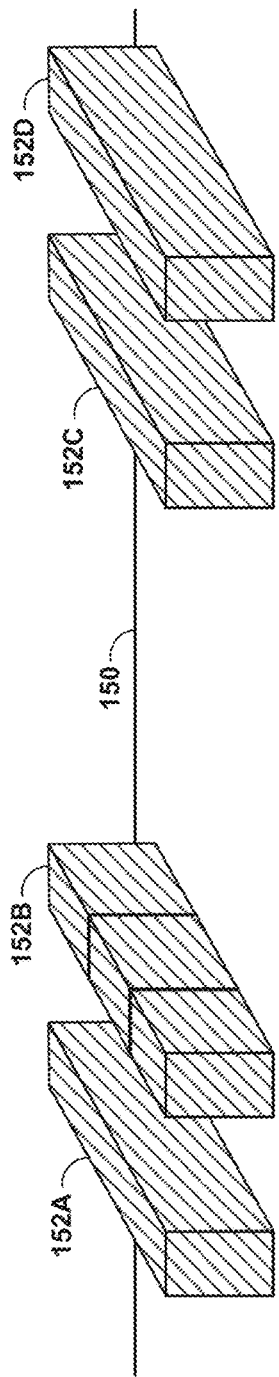
FIGS. 8-10 are perspective diagrams of a fabrication process for circuit package, in accordance with some examples of this disclosure.
Figure 9:
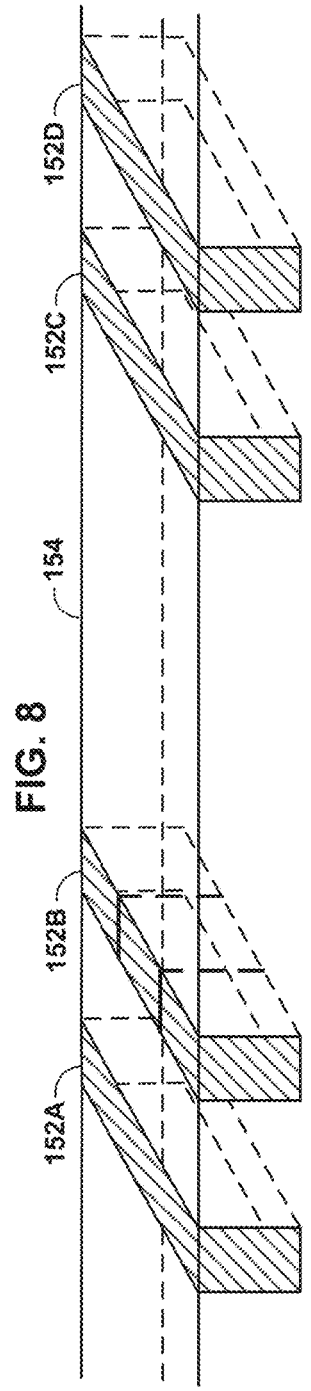
Figure 10:
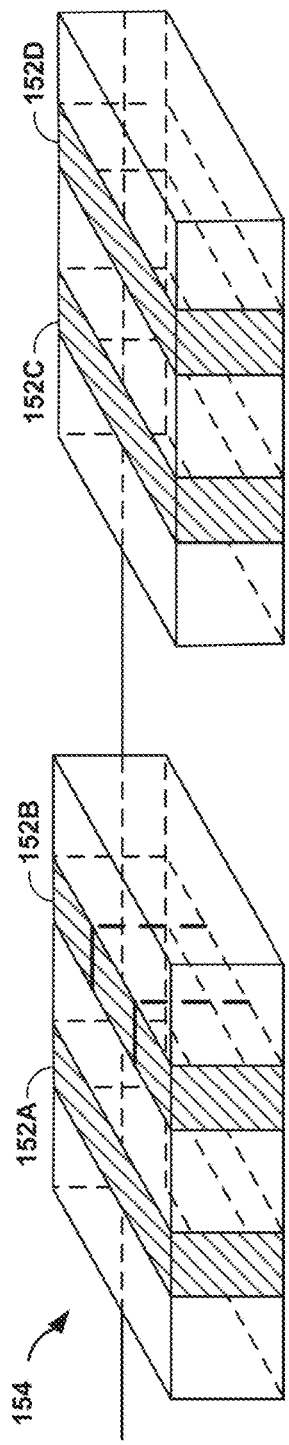

FIGS. 8-10 are perspective diagrams of a fabrication process for circuit package, in accordance with some examples of this disclosure. FIG. 8 depicts four vertical conductive paths 152A-152D arranged on carrier substrate 150. Vertical conductive paths 152A-152D may be arranged horizontally during the fabrication process, but if the circuit package is attached to a PCB, vertical conductive paths 152A-152D may be arranged in an orthogonal direction with respect to the PCB. Vertical conductive paths 152A-152D may be arranged such that there are small gaps between vertical conductive paths 152A, 152B and between vertical conductive paths 152C, 152D. There may be a larger gap between vertical conductive paths 152B, 152C. In some examples, vertical conductive path 152B may comprise three separate conductive components arranged in series for designs with high electrical current.

Vertical conductive paths 152A-152D are depicted as bars or pillars, but vertical conductive paths 152A-152D may be any suitable shape, such as cylindrical or rectangular. Vertical conductive paths 152A-152D may have dimensions that depend on the dimensions of circuit package. In some examples, vertical conductive paths 152A-152D may be approximately one hundred micrometers or two hundred micrometers in width and thickness. Vertical conductive paths 152A-152D may have a length of approximately two or three millimeters, depending on the dimensions of the circuit package.

FIG. 9 depicts the formation of insulating layer 154 across four vertical conductive paths 152A-152D. Insulating layer 154 may form in the gaps between vertical conductive paths 152A-152D, such that vertical conductive paths 152A-152D may extend from one side of insulating layer 154 to the opposite side of insulating layer 154. In some examples, insulating layer 154 may surround vertical conductive paths 152A-152D on four sides of vertical conductive paths 152A-152D, instead of two sides of vertical conductive paths 152A-152D, as depicted in FIG. 9. Insulating layer 154 may be a dielectric material that impedes the flow of electricity among vertical conductive paths 152A-152D.

After insulating layer 154 has formed around vertical conductive paths 152A-152D, carrier substrate 150 may be removed. Insulating layer 154 may hold vertical conductive paths 152A-152D in place after carrier substrate 150 is removed. The fabrication process may also include carrier tape or tacky tape (not shown in FIG. 9) for holding vertical conductive paths 152A-152D and insulating layer 154 together. The tape may be removed after the fabrication process is complete.

FIG. 10 depicts the removal of a portion of insulating layer 154 between vertical conductive paths 152B, 152C. By removing, or "punching out," the portion of insulating layer 154 between vertical conductive paths 152B, 152C, a gap may be formed in insulating layer 154. As shown in FIG. 7, vertical conductive paths 152A-152D may not have metal layers on one end because vertical conductive paths 152A-152D may connect directly to a PCB or other device.

Figure 11:
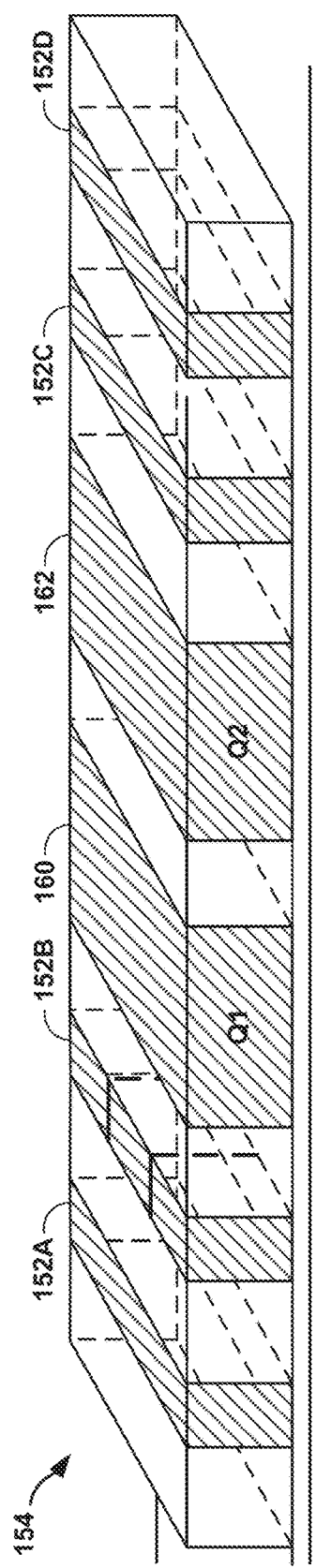
FIG. 11 is a perspective diagram of a circuit package with two vertical transistors and four vertical conductive paths in an insulating layer, in accordance with some examples of this disclosure.

FIG. 11 is a perspective diagram of a circuit package with two vertical transistors 160, 162 and four vertical conductive paths 152A-152D in an insulating layer 154, in accordance with some examples of this disclosure. Transistors 160, 162 may be attached to insulating layer 154 between vertical conductive paths 152B, 152C. A portion of insulating layer 154 may separate each of transistors 160, 162, impeding the flow of electricity between transistors 160, 162.

Figure 12:
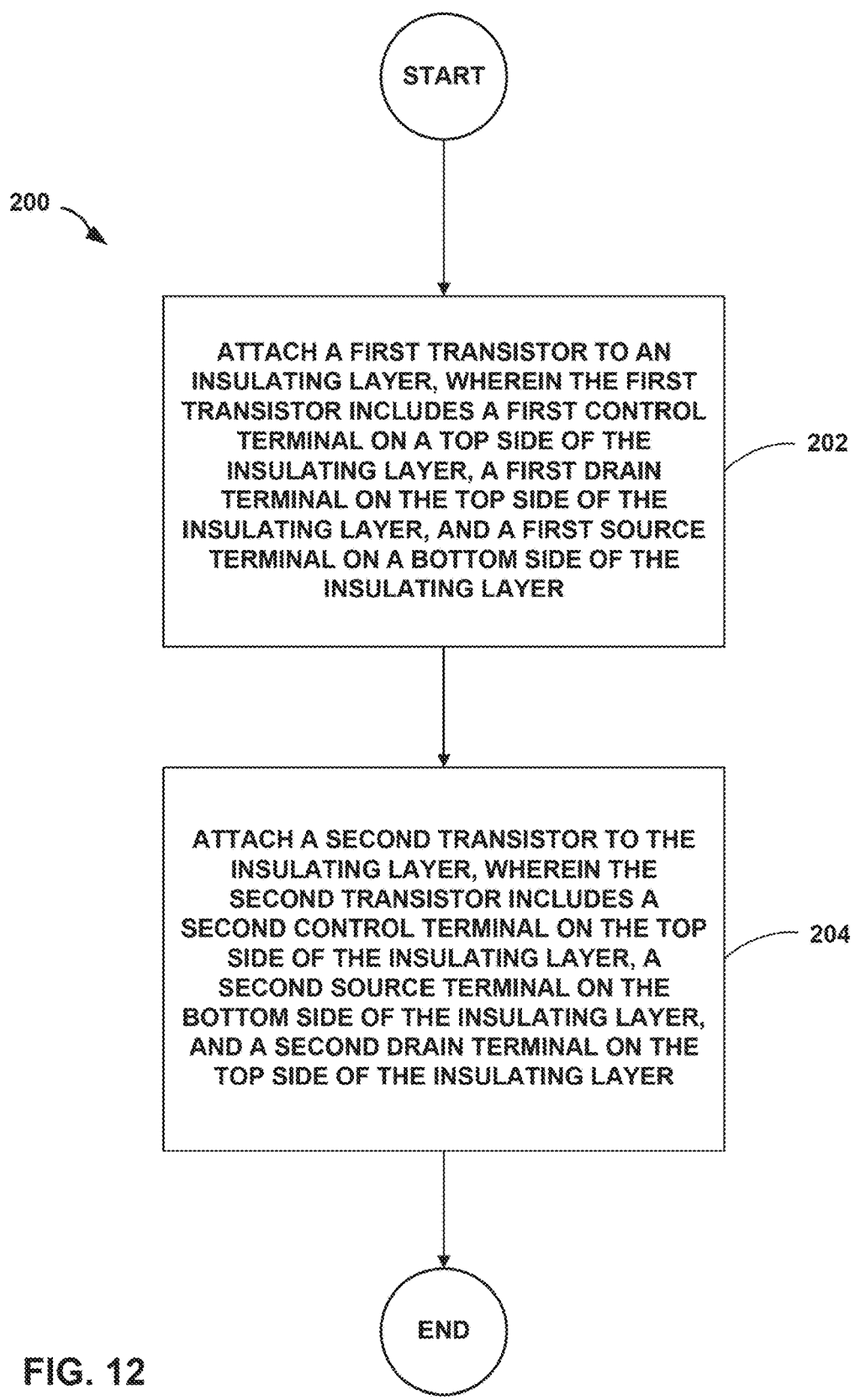
FIG. 12 is a flowchart illustrating an example technique for fabricating a circuit package, in accordance with some examples of this disclosure.

FIG. 12 is a flowchart illustrating an example technique 200 for fabricating a circuit package, in accordance with some examples of this disclosure. Technique 200 is described with reference to insulating layer 154 and transistors 160, 162 in FIG. 11, although other components, such as transistors 82, 84 in FIG. 6 and transistors 112, 114 in FIG. 7, may exemplify similar techniques.

The technique of FIG. 12 includes attaching a first transistor 160 to an insulating layer 154 (202). Transistor 160 includes a first control terminal on a top side of insulating layer 154, a first source terminal on the top side of insulating layer 154, and a first drain terminal on a bottom side of insulating layer 154.

The technique of FIG. 12 further includes attaching a first transistor 162 to an insulating layer 154 (204). Transistor 162 includes a second control terminal on the top side of insulating layer 154, a second drain terminal on the top side of insulating layer 154, and a second source terminal on the bottom side of insulating layer 154. Transistors 160, 162 may be vertical power MOSFETs that are arranged in a power converter. By arranging the first source terminal and the second drain terminal on the top side of insulating layer 154, the connection between the first source terminal and the second drain terminal may be shortened, as compared to two source-up transistors. The connection between the first source terminal and the second drain terminal may also reduce parasitic capacitances within the circuit package.

The following numbered examples demonstrate one or more aspects of the disclosure.

Example 1

A circuit package includes an insulating layer and a first transistor extending through the insulating layer, where the first transistor includes a first control terminal on a top side of the insulating layer, a first source terminal on the top side of the insulating layer, and a first drain terminal on a bottom side of the insulating layer. The circuit package includes a second transistor extending through the insulating layer, where the second transistor includes a second control terminal on the top side of the insulating layer, a second source terminal on the bottom side of the insulating layer, and a second drain terminal on the top side of the insulating layer.

Example 2

The circuit package of example 1, the circuit package further comprising a first horizontal conductive path that is electrically connected to the first source terminal and the second drain terminal, wherein the first horizontal conductive path does not extend into the insulating layer.

Example 3

The circuit package of any combination of examples 1 or 2, further comprising a second horizontal conductive path that is electrically connected to the first control terminal and a first vertical conductive path extending through the insulating layer, wherein the second horizontal conductive path is electrically isolated from the first horizontal conductive path.

Example 4

The circuit package of any combination of examples 1-3, further comprising a third horizontal conductive path that is electrically connected to the second control terminal and a second vertical conductive path extending through the insulating layer, wherein the third horizontal conductive path is electrically isolated from the first horizontal conductive path and the second horizontal conductive path.

Example 5

The circuit package of any combination of examples 1-4, wherein the first horizontal conductive path is configured to conduct electricity with an inductor, the circuit package further comprising a third vertical conductive path extending through the insulating layer, wherein the third vertical conductive path is configured to conduct electricity with the inductor.

Example 6

The circuit package of any combination of examples 1-5, wherein the first horizontal conductive path includes a first copper plate, the second horizontal conductive path includes a second copper plate, and the third horizontal conductive path includes a third copper plate.

Example 7

The circuit package of any combination of examples 1-6, wherein the first transistor comprises a discrete n-channel vertical FET, the second transistor comprises a discrete n-channel vertical FET, the first control terminal comprises a first gate terminal, and the second control terminal comprises a second gate terminal.

Example 8

The circuit package of any combination of examples 1-7, wherein the first drain terminal is electrically connected to an input node, the second source terminal is electrically connected to a reference voltage, and the first control terminal and the second control terminal are electrical connected to a driver circuit.

Example 9

The circuit package of any combination of examples 1-8, further comprising a pre-formed support structure attached to the first transistor and to the second transistor, wherein the pre-formed support structure includes at least two vertical conductive paths.

Example 10

The circuit package of any combination of examples 1-9, wherein the insulating layer comprises FR4 or resin film without fiber reinforcement.

Example 11

A method comprises attaching a first transistor to an insulating layer with a first control terminal on a top side of the insulating layer a first drain terminal on the top side of the insulating layer, and a first source terminal on a bottom side of the insulating layer. The method further comprises attaching a second transistor to the insulating layer with a second control terminal on the top side of the insulating layer, a second source terminal on the bottom side of the insulating layer, and a second drain terminal on the top side of the insulating layer.

Example 12

The method of example 11, further comprising electrically connecting a first horizontal conductive path to the first source terminal and the second drain terminal, wherein the first horizontal conductive path does not extend into the insulating layer.

Example 13

The method of any combination of examples 11 or 12, further comprising forming a first vertical conductive path through the insulating layer and electrically connecting a second horizontal conductive path to the first control terminal and the first vertical conductive path, wherein the second horizontal conductive path is electrically isolated from the first horizontal conductive path.

Example 14

The method of any combination of examples 11-13, further comprising forming a second vertical conductive path through the insulating layer and electrically connecting a third horizontal conductive path to the second control terminal and the second vertical conductive path, wherein the third horizontal conductive path is electrically isolated from the first horizontal conductive path and the second horizontal conductive path.

Example 15

The method of any combination of examples 11-14, further comprising forming a third vertical conductive path through the insulating layer, electrically connecting the first horizontal conductive path to an inductor, and electrically connecting the inductor and the third vertical conductive path.

Example 16

The method of any combination of examples 11-15, wherein the first transistor comprises a discrete n-channel vertical field-effect transistor (FET), the second transistor comprises a discrete n-channel vertical FET, the first control terminal comprises a first gate terminal, and the second control terminal comprises a second gate terminal.

Example 17

The method of any combination of examples 11-16, further comprising electrically connecting the first drain terminal and an input node, electrically connecting the second source terminal and a reference voltage, and electrically connecting the first control terminal and the second control terminal to a driver circuit.

Example 18

The method of any combination of examples 11-17, further comprising forming a first vertical conductive path and a second vertical conductive path in the insulating layer, wherein the insulating layer comprises a dielectric material. The method further comprises removing a portion of the insulating layer between the first vertical conductive path and the second vertical conductive path. The method further comprises attaching the first transistor and the second transistor to the insulating layer between the first vertical conductive path and the second vertical conductive path.

Example 19

The method of any combination of examples 11-18, wherein the dielectric layer comprises FR4 or resin film without fiber reinforcement.

Example 20

A device comprises an insulating layer and a first transistor extending through the insulating layer with a first control terminal on a top side of the insulating layer, a first source terminal on the top side of the insulating layer, and a first drain terminal on a bottom side of the insulating layer. The device further comprises a second transistor extending through the insulating layer with a second control terminal on the top side of the insulating layer, a second source terminal on the bottom side of the insulating layer, and a second drain terminal on the top side of the insulating layer. The device further comprises an inductor and a conductive path that is electrically connected to the first source terminal, the second drain terminal, and the inductor, wherein the conductive path does not extend into the insulating layer.

Various examples of the disclosure have been described. Any combination of the described systems, operations, or functions is contemplated. These and other examples are within the scope of the following claims.

What is claimed is:

1. A circuit package comprising:
   an insulating layer;
   a first transistor extending through the insulating layer, the first transistor including:
      a first control terminal on a top-most side of the first transistor,
      a first source terminal on the top-most side of the first transistor, and
      a first drain terminal on a bottom-most side of the first transistor;
   a second transistor extending through the insulating layer, the second transistor including:
      a second control terminal on a top-most side of the second transistor,
      a second source terminal on a bottom-most side of the second transistor, and
      a second drain terminal on the top-most side of the second transistor; and
   a conductive path that is electrically connected to the first source terminal and the second drain terminal.

2. The circuit package of claim 1,
   wherein the conductive path comprises a first horizontal conductive path that does not extend into the insulating layer,
   the circuit package further comprising a second horizontal conductive path that is electrically connected to the first control terminal and a first vertical conductive path extending through the insulating layer,
   wherein the second horizontal conductive path is electrically isolated from the first horizontal conductive path.

3. The circuit package of claim 2, further comprising a third horizontal conductive path that is electrically connected to the second control terminal and a second vertical conductive path extending through the insulating layer,
   wherein the third horizontal conductive path is electrically isolated from the first horizontal conductive path and the second horizontal conductive path.

4. The circuit package of claim 3,
   wherein the first horizontal conductive path is configured to conduct electricity with an inductor,
   the circuit package further comprising a third vertical conductive path extending through the insulating layer, wherein the third vertical conductive path is configured to conduct electricity with the inductor.

5. The circuit package of claim 3, wherein:
   the first horizontal conductive path includes a first copper plate;
   the second horizontal conductive path includes a second copper plate; and
   the third horizontal conductive path includes a third copper plate.

6. The circuit package of claim 1, wherein:
   the first transistor comprises a discrete n-channel vertical field-effect transistor (FET);
   the second transistor comprises a discrete n-channel vertical FET;
   the first control terminal comprises a first gate terminal; and
   the second control terminal comprises a second gate terminal.

7. The circuit package of claim 1, wherein:
   the first drain terminal is electrically connected to an input node;
   the second source terminal is electrically connected to a reference voltage; and
   the first control terminal and the second control terminal are electrical connected to a driver circuit.

8. The circuit package of claim 1, further comprising a pre-formed support structure attached to the first transistor and to the second transistor, wherein the pre-formed support structure includes at least two vertical conductive paths.

9. The circuit package of claim 1, wherein the insulating layer comprises FR4 or resin film without fiber reinforcement.

10. The circuit package of claim 1,
    wherein the conductive path is positioned on the top-most side of the first transistor, and
    wherein the conductive path is positioned on the top-most side of the second transistor.

11. A method comprising:
    attaching a first transistor to an insulating layer, wherein the first transistor includes:
       a first control terminal on a top-most side of the first transistor,
       a first drain terminal on a bottom-most side of the first transistor, and
       a first source terminal on the top-most side of the first transistor;
    attaching a second transistor to the insulating layer, wherein the second transistor includes:
       a second control terminal on a top-most side of the second transistor,
       a second source terminal on a bottom-most side of the second transistor, and
       a second drain terminal on the top-most side of the second transistor; and
    electrically connecting a conductive path to the first source terminal and the second drain terminal.

12. The method of claim 11,
    wherein electrically connecting the conductive path comprises electrically connecting a first horizontal conductive path to the first source terminal and the second drain terminal, and wherein the first horizontal conductive path does not extend into the insulating layer, the method further comprising:

forming a first vertical conductive path through the insulating layer; and electrically connecting a second horizontal conductive path to the first control terminal and the first vertical conductive path, wherein the second horizontal conductive path is electrically isolated from the first horizontal conductive path.

13. The method of claim 12, further comprising:

forming a second vertical conductive path through the insulating layer; and electrically connecting a third horizontal conductive path to the second control terminal and the second vertical conductive path, wherein the third horizontal conductive path is electrically isolated from the first horizontal conductive path and the second horizontal conductive path.

14. The method of claim 13, further comprising:

forming a third vertical conductive path through the insulating layer;

electrically connecting the first horizontal conductive path to an inductor; and electrically connecting the inductor and the third vertical conductive path.

15. The method of claim 11, wherein:

the first transistor comprises a discrete n-channel vertical field-effect transistor (FET);

the second transistor comprises a discrete n-channel vertical FET;

the first control terminal comprises a first gate terminal; and the second control terminal comprises a second gate terminal.

16. The method of claim 11, further comprising:

electrically connecting the first drain terminal and an input node;

electrically connecting the second source terminal and a reference voltage; and electrically connecting the first control terminal and the second control terminal to a driver circuit.

17. The method of claim 11, further comprising:

forming a first vertical conductive path and a second vertical conductive path in the insulating layer, wherein the insulating layer comprises FR4 or resin film without fiber reinforcement;

removing a portion of the insulating layer between the first vertical conductive path and the second vertical conductive path; and attaching the first transistor and the second transistor to the insulating layer between the first vertical conductive path and the second vertical conductive path.

18. A device comprising:

an insulating layer;

a first transistor extending through the insulating layer, the first transistor including:

a first control terminal on a top-most side of the first transistor, a first source terminal on the top-most side of the first transistor, and a first drain terminal on a bottom-most side of the first transistor;

a second transistor extending through the insulating layer, the second transistor including:

a second control terminal on a top-most side of the second transistor, a second source terminal on a bottom-most side of the second transistor, and a second drain terminal on the top-most side of the second transistor; and an inductor; and a first horizontal conductive path that is electrically connected to the first source terminal, the second drain terminal, and the inductor, wherein the conductive path does not extend into the insulating layer;

a second horizontal conductive path that is electrically connected to the first control terminal, wherein the second horizontal conductive path is electrically isolated from the first horizontal conductive path; and a first vertical conductive path extending through the insulating layer.

19. The device of claim 18, further comprising a third horizontal conductive path that is electrically connected to the second control terminal and a second vertical conductive path extending through the insulating layer, wherein the third horizontal conductive path is electrically isolated from the first horizontal conductive path and the second horizontal conductive path.

20. The device of claim 18, wherein the first horizontal conductive path is electrically connected to a first node of the inductor, the device further comprising a third vertical conductive path extending through the insulating layer, wherein the third vertical conductive path is electrically connected to a second node of the inductor.

* * * * *